(12) United States Patent
Gannamani et al.

(10) Patent No.: US 6,241,907 B1
(45) Date of Patent: Jun. 5, 2001

(54) METHOD AND SYSTEM FOR PROVIDING A PACKAGE FOR DECAPSULATING A CHIP-SCALE PACKAGE

(75) Inventors: Ranjit Gannamani, Santa Clara; Xia Li, Fremont, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/208,824

(22) Filed: Dec. 9, 1998

(51) Int. Cl.[7] .................................................. B44C 1/22
(52) U.S. Cl. ............................ 216/83; 216/38; 216/56; 156/345
(58) Field of Search ........................ 324/758; 216/56, 216/90, 92, 83; 156/345, 300; 29/840, 856

(56) References Cited

U.S. PATENT DOCUMENTS

| | | | |
|---|---|---|---|
| 3,765,590 * | 10/1973 | Duffek et al. | 228/6 |
| 3,859,715 * | 1/1975 | Duffek et al. | 29/588 |
| 3,947,867 * | 3/1976 | Duffek et al. | 357/70 |
| 5,548,884 * | 8/1996 | Kim | 29/593 |
| 5,634,267 * | 6/1997 | Farnsworth et al. | 29/840 |
| 5,640,762 * | 6/1997 | Farnsworth et al. | 29/833 |
| 5,766,496 * | 6/1998 | Martin | 216/56 |
| 5,783,098 * | 7/1998 | Martin et al. | 216/56 |
| 5,792,305 * | 8/1998 | Winsemius et al. | 156/345 |
| 5,796,264 * | 8/1998 | Farnsworth et al. | 324/758 |
| 5,855,727 * | 1/1999 | Martin et al. | 156/345 |
| 5,861,662 * | 1/1999 | Candelore | 257/679 |
| 5,930,652 * | 7/1999 | Mukerji et al. | 438/459 |
| 5,951,804 * | 9/1999 | Kweon et al. | 156/244 |

* cited by examiner

*Primary Examiner*—Chandra Chaudhari
*Assistant Examiner*—Laura M Schillinger
(74) *Attorney, Agent, or Firm*—Sawyer Law Group LLP

(57) ABSTRACT

A system and method for decapsulating a chip-scale package having a first width are disclosed. The method and system include coupling the chip-scale package to a substantially rigid receptacle. The receptacle has a second width and a periphery. The second width is larger than the first width. The chip-scale package does not extend to the periphery of the receptacle. The method and system further include holding the receptacle in proximity to the periphery and decapsulating the chip-scale package.

14 Claims, 5 Drawing Sheets

METHOD AND SYSTEM FOR PROVIDING A PACKAGE FOR DECAPSULATING A CHIP-SCALE PACKAGE

FIELD OF THE INVENTION

The present invention relates to detection of faults in semiconductor devices and more particularly to a method and system for providing a package to facilitate decapsulation of a chip-scale package.

BACKGROUND OF THE INVENTION

Chip-scale packages are increasingly used in semiconductor applications. Chip-scale packages are so named because of their size. The entire package is on the order of the size of the semiconductor die, or chip, within the package. Typically, a chip scale package includes a substrate to which the semiconductor die is attached. The semiconductor die is typically attached to one side of the substrate and encapsulated in an epoxy molding compound. The substrate typically includes a plurality of conductive traces which run through the substrate, electrically coupling the semiconductor die to solder balls. The solder balls are typically on the opposite side of the substrate as the semiconductor die. The solder balls are used to electrically couple the chip-scale package to an external system board.

In order to determine if semiconductor devices are being designed and manufactured properly, it is often desirable to deprocess the semiconductor devices. In larger, conventional packages, the package is mounted on an apparatus. Typically, the edges of the package are used to hold the package. The plastic molding compound is then removed from the top surface of the die by chemical etching, exposing the semiconductor die. The semiconductor die can then be examined and diagnosed when exposed. Additional layers of the semiconductor die can also be removed to further examine and diagnose the semiconductor die. Thus, the package is decapsulated and the functionality of the semiconductor die checked.

For similar reasons, it is also desirable to decapsulate chip-scale packages. In order to decapulate a chip-scale package in a conventional manner, the edges of the chip-scale packages are used to hold the package in place during decapsulating. Layers of the chip-scale package are then removed. For example, a portion of the encapsulant may be etched to expose the semiconductor die. The semiconductor die is then tested.

Although conventional methods for decapsulating the chip-scale package can provide information relating to the chip-scale package, much of the chip-scale package cannot be decapsulated using the conventional method. The chip-scale package is on the order of the same size as the semiconductor die. Thus, when the edges of the chip-scale package are used to hold the chip-scale package in place, a portion of the semiconductor die remains covered. As a result, only the central portion of the semiconductor die is typically exposed and tested. The periphery of the semiconductor die remains intact. For example, bond pads for connecting the semiconductor die to the substrate usually are near the periphery of the semiconductor die. Consequently, the bond pads may not be tested. In the alternative, if the edges of the chip-scale package are exposed for etching, then chemicals used to etch the encapsulant may run down the sides of the chip-scale package. Thus, the substrate may be etched instead of the molding compound. Consequently, the desired portion of the semiconductor die may not be exposed.

Accordingly, what is needed is a system and method for providing a method for decapsulating a chip-scale package. The present invention addresses such a need.

SUMMARY OF THE INVENTION

The present invention provides a method and system for decapsulating a chip-scale package having a first width. The method and system comprise coupling the chip-scale package to a substantially rigid receptacle. The receptacle has a second width and a periphery. The second width is larger than the first width. The chip-scale package does not extend to the periphery of the receptacle. The method and system further comprise holding the receptacle in proximity to the periphery and decapsulating the chip-scale package.

According to the system and method disclosed herein, the present invention allows for chip-scale packages to be better decapsulated, thereby increasing overall system performance.

DETAILED DESCRIPTION OF THE INVENTION

The present invention relates to an improvement in decapsulating of chip-scale packages. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
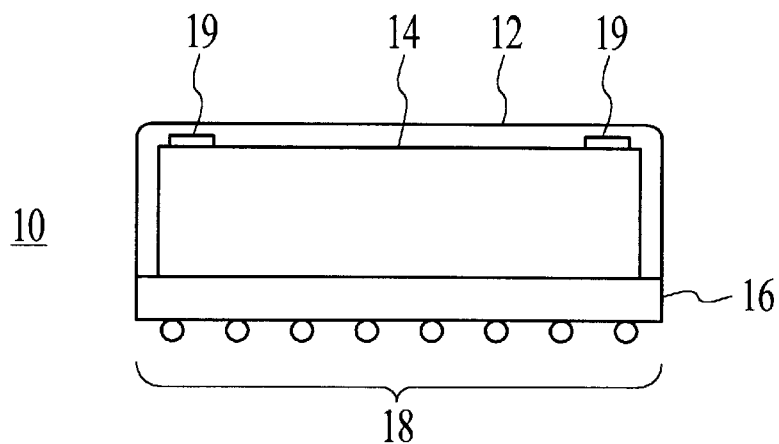
FIG. 1A is a diagram of a chip-scale package.

FIG. 1A is a diagram of a chip-scale package 10. The chip-scale package 10 typically includes a semiconductor die 14 enclosed in an encapsulant 12, such as a molding compound. The encapsulant 12 seals the semiconductor die 14 and affixes the semiconductor die 14 to a substrate 16. On an opposing side of the substrate 16 are solder balls 18. The solder balls 18 electrically couple the chip-scale package 10 to an external circuit board (not shown). The semiconductor die 14 is coupled to the solder balls 18 through traces (not shown) in the substrate 16. The semiconductor die 14 is electrically coupled to solder balls 18 below the substrate 16 through bonding pads 19 and metal traces (not shown).

Figure 1B:
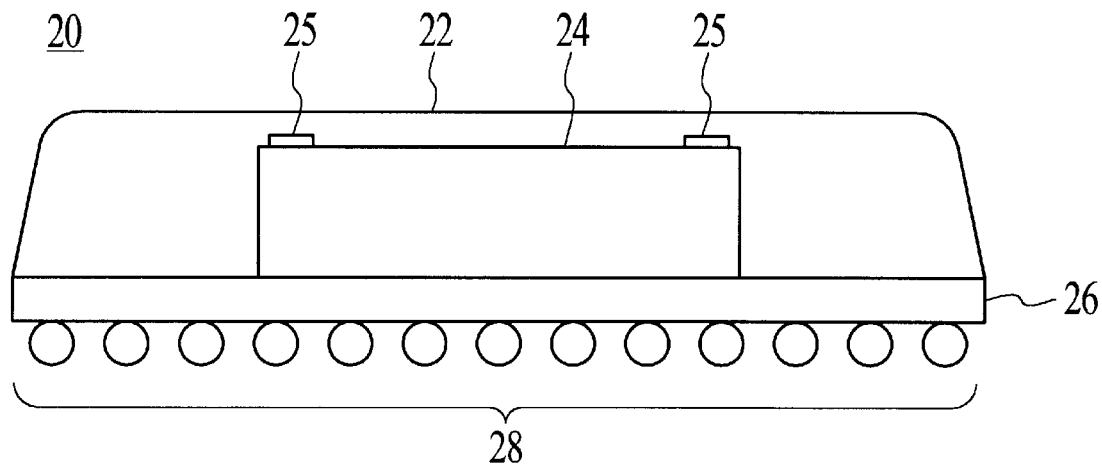
FIG. 1B is a diagram of a conventional package.

FIG. 1B depicts a conventional package 20. The package 20 includes a semiconductor die 24 enclosed in packaging 22. The semiconductor die 24 is attached to a substrate 26 which is substantially larger than the semiconductor die 24. Electrical connection is typically made to circuits in the semiconductor die 24 using bond pads 25. The bond pads are connected to the solder balls 18 through metal traces (not shown). The conventional package 20 is electrically connected to an external system board via the solder balls 28. Thus, the conventional package 20 is typically significantly larger than the chip-scale package 10.

Figure 2:
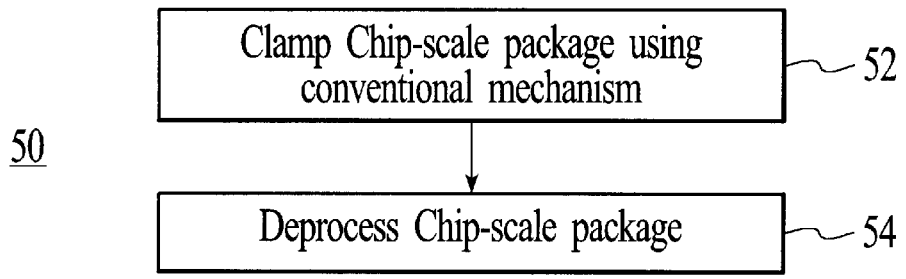
FIG. 2 is a flow chart depicting a conventional method for decapsulating a chip-scale package.

The chip-scale package 10 and the conventional package 20 can be decapsulated using conventional means. FIG. 2 depicts a conventional method 50 for decapsulating the chip-scale package 10. The chip-scale package is clamped in place using a conventional mechanism, via step 52. The conventional mechanism was developed for use with the conventional package 20. Referring back to FIG. 1B, when used in conjunction with the conventional package 20, the mechanism clamps the package away from the semiconductor die 24. For example, gaskets (not shown) may be used to clamp the packaging 22 and the substrate 26. Referring back to FIG. 2, once the chip-scale package 10 is clamped in place, decapsulating is continued, via step 54. Typically, the encapsulant 12 is etched to reveal a portion of the semiconductor die 14. Portions of the semiconductor die 14 are then tested.

Figure 3:
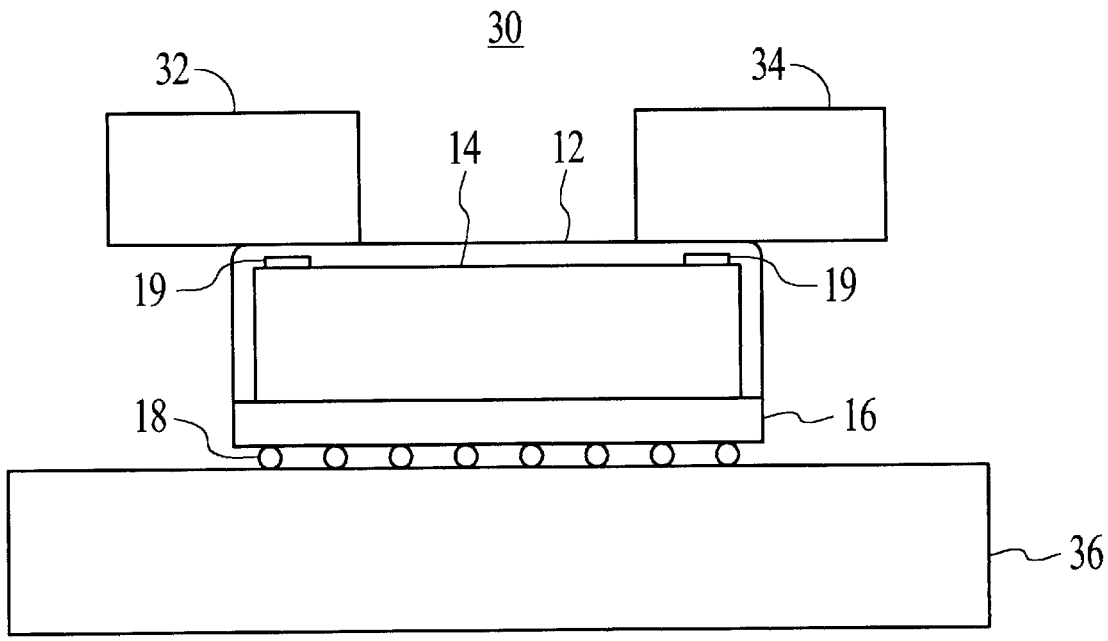
FIG. 3 is a diagram of a chip-scale package during conventional decapsulation.

FIG. 3 depicts a chip-scale package 10 during conventional decapsulation carried out in accordance with the conventional method 50. Although the conventional method 50 shown in FIG. 2 is capable of decapsulating a portion of the chip-scale package 10, those with ordinary skill in the art will realize that the method 50 may not expose some portions of the chip-scale package 10 which are of interest. The conventional clamps 32, 34, and 36 are used to hold the chip-scale package 10 in place. Because of the size of the chip-scale package 10, the clamps 32 and 34 extend over a portion of the semiconductor die 14. For example, the clamps 32 and 34 extend over the bond pads 19.

Because the clamps 32 and 34 extend over a portion of the semiconductor die 14, one of ordinary skill in the art will realize that portions of the semiconductor die may not be decapsulated. Only the portion of the encapsulant 12 between the clamps 32 and 34 is exposed and, therefore, etched. As a result, only the central portion of the semiconductor die 14 is exposed during decapsulation. Consequently, portions of the semiconductor die 14 near the edge of the semiconductor die 14 may not be decapsulated. For example, the area of the semiconductor die 14 including the bond pads 19 may not be decapsulated. These portions of the chip-scale package such as the bond pads 19 may be of interest. Thus, it may not be possible to detect faults after decapsulation of the semiconductor die 14.

Even if the clamps 32 and 34 are not used, the conventional method 50 may not be adequate for decapsulating the chip-scale package 10. For example, if the chip-scale package is not held in place during etching, chemicals used to etch the encapsulant 12 in the step 54 of decapsulating the chip-scale package 10 may run down the sides of the encapsulant 12 and attack the substrate 16. Thus, the substrate 16 may be inadvertently destroyed during decapsulation. As a result, electrical connection may not be made to the semiconductor die 14. Consequently, an experimenter may not be able to test the function of the semiconductor die 14 after decapsulation via step 54. Thus, using the conventional method 50 to decapsulate the chip-scale package 10 may result in an experimenter being unable to adequately investigate portions of the chip-scale package 10.

The present invention provides for a method and system for decapsulating a chip-scale package having a first width. The method and system comprise coupling the chip-scale package to a substantially rigid receptacle. The receptacle has a second width and a periphery. The second width is larger than the first width. The chip-scale package does not extend to the periphery of the receptacle. The method and system further comprise holding the receptacle in proximity to the periphery and decapsulating the chip-scale package.

The present invention will be described in terms of particular receptacles, particular chip-scale packages, and particular methods for decapsulating the package. However, one of ordinary skill in the art will readily recognize that this method and system will operate effectively for other types of packages, other receptacles, and other methods of decapsulating the chip-scale packages.

Figure 4:
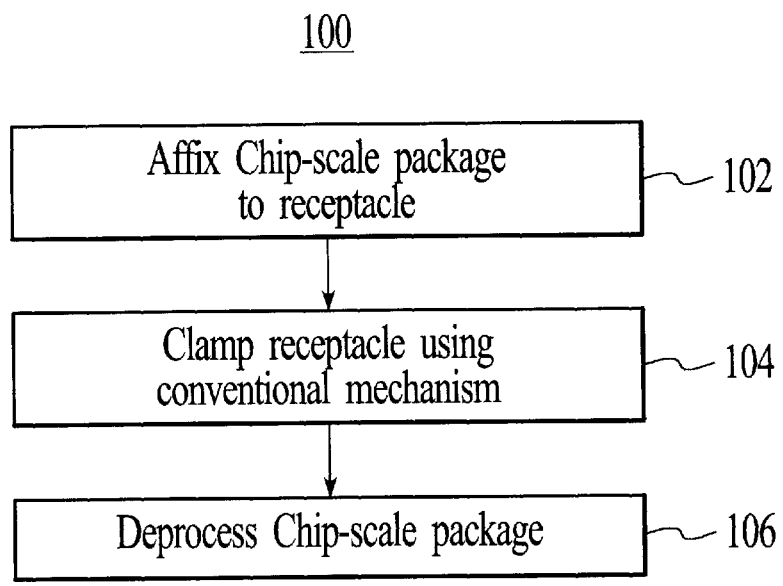
FIG. 4 is a flow chart depicting a method for decapsulating a chip-scale package in accordance with the present invention.

To more particularly illustrate the method and system in accordance with the present invention, refer now to FIG. 4 depicting a method 100 for decapsulating a chip-scale package in accordance with the present invention. The chip-scale package 10 is affixed in a receptacle, via step 102. The receptacle is larger than the chip-scale package 10. Preferably, the periphery of the receptacle extends beyond the chip-scale package 10. In one embodiment, the receptacle could include a socket in which the chip-scale package 10 fits. In another embodiment, the receptacle could be in the form of a conventional package, such as the conventional package 20 in which the chip-scale package 10 could fit. In one embodiment, the step 102 of fixing the chip-scale package 10 in the receptacle includes heating the chip-scale package so that the solder balls 18 melt, electrically and mechanically coupling the chip-scale package 10 to the receptacle. The receptacle is then clamped in place using a conventional mechanism, via step 104. In a preferred embodiment, the receptacle is clamped at the periphery, which extends beyond the chip-scale package 10. The chip-scale package 10 is then decapsulated, via step 106. Because the receptacle rather than the chip-scale package 10 is clamped, the chip-scale package 10 can be adequately decapsulated.

Figure 5:
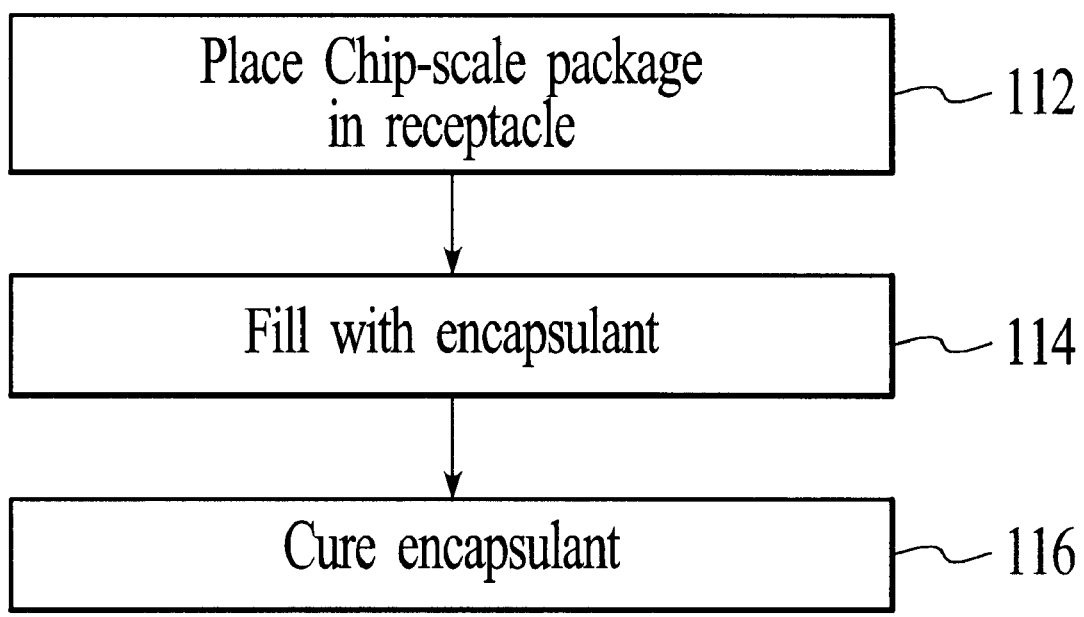
FIG. 5 is a flow chart depicting one embodiment of a method for affixing the chip-scale package to a receptacle in accordance with the present invention.

FIG. 5 depicts one embodiment of the step 102 of affixing the chip-scale package 10 to the receptacle. The chip-scale package 10 is placed in the receptacle, via step 112. In such an embodiment, the receptacle would include a cavity for the chip-scale package 10. In one embodiment, placing the chip-scale package 10 in the receptacle includes making electrical connection to the circuits within the chip-scale package 10. For example, in one embodiment, step 112 includes melting the solder balls 18 in order to provide electrical contact. The cavity is then filled with an encapsulant, via step 114. In one embodiment, the encapsulant is a molding compound. The encapsulant is then cured, via step 116.

Figure 6A:
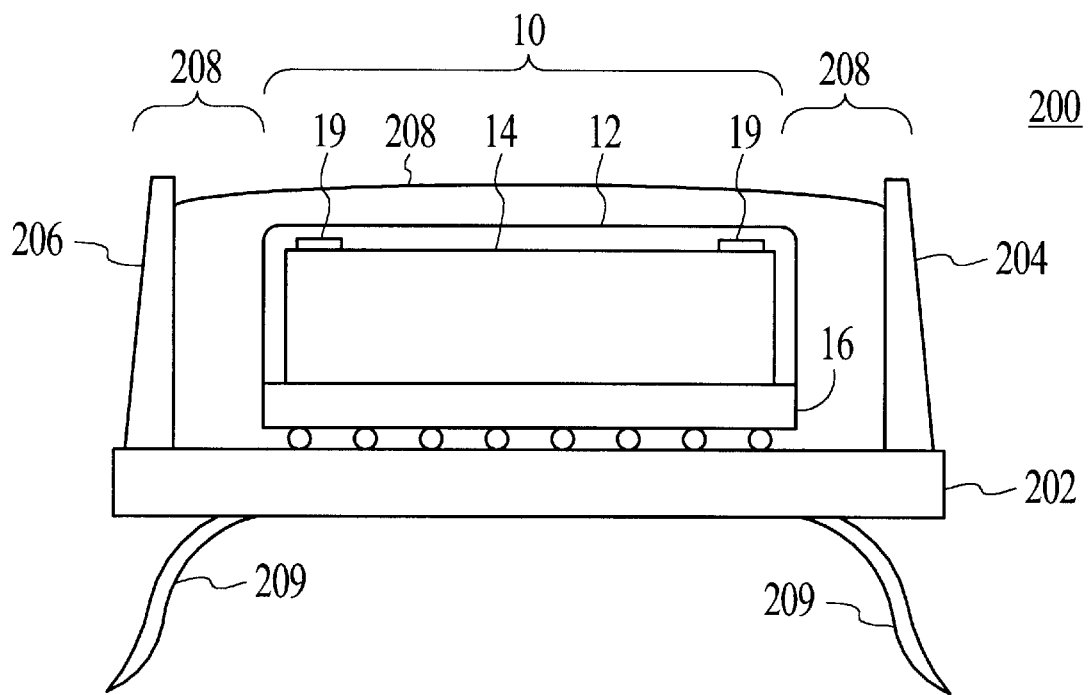
FIG. 6A is one embodiment the chip-scale package being held within a receptacle in accordance with the present invention.

FIG. 6A depicts one embodiment of the receptacle 200 discussed in conjunction with the method 100 and the step 102 shown in FIG. 5. The receptacle 200 is shown with the chip-scale package 10 contained within a cavity formed between the dams 204 and 206. Although labeled with different numbers and only shown on two sides of the chip-scale package, the dams 204 and 206 surround the chip-scale package. Thus, the dams 204 and 206 may be part of a continuous dam on all four sides of the chip-scale package 10. The receptacle 200 also includes a substrate 202 and an encapsulant 208. The encapsulant 208 fills the cavity between the dams 204 and 206. In the embodiment shown, the receptacle 200 also includes pins 209 for making electrical contact to a testing apparatus (not shown). The substrate 202 essentially functions as an interposer connecting the solder balls 18 to the pins 209. The receptacle 200 has a periphery 208 which extends beyond the chip-scale package 10. The periphery 208 includes the dams 204 and 206, as well as a part of the encapsulant 208. The periphery 208 may be used to hold the receptacle 200 and, therefore, the chip-scale package 10 in place.

Figure 6B:
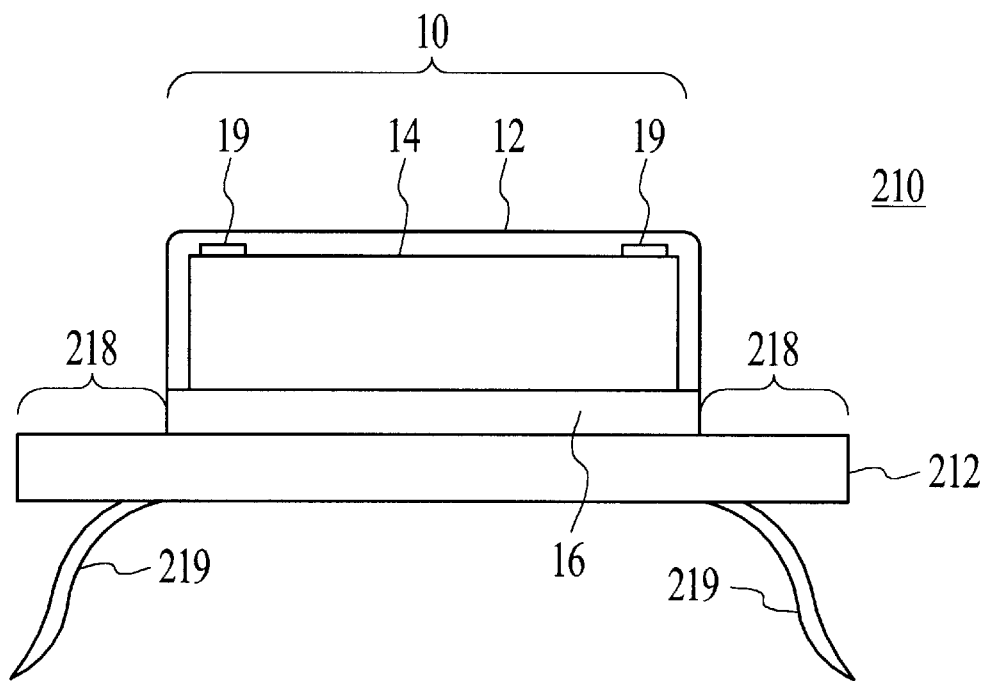
FIG. 6B is a second embodiment the chip-scale package being held in a receptacle in accordance with the present invention.

FIG. 6B depicts another embodiment of the receptacle 210. The receptacle 210 is shown with the chip-scale package 10 attached via the solder balls (not shown). The receptacle 210 also includes a substrate 212 and pins 219 for making electrical contact to a testing apparatus (not shown). In this embodiment, the solder balls 18 have been melted to make electrical contact to the chip-scale package 10. The receptacle 210 includes a periphery 218 which extends beyond the chip-scale package 10. The periphery 218 may be used to hold the receptacle 210 and, therefore, the chip-scale package 10 in place.

Figure 7A:
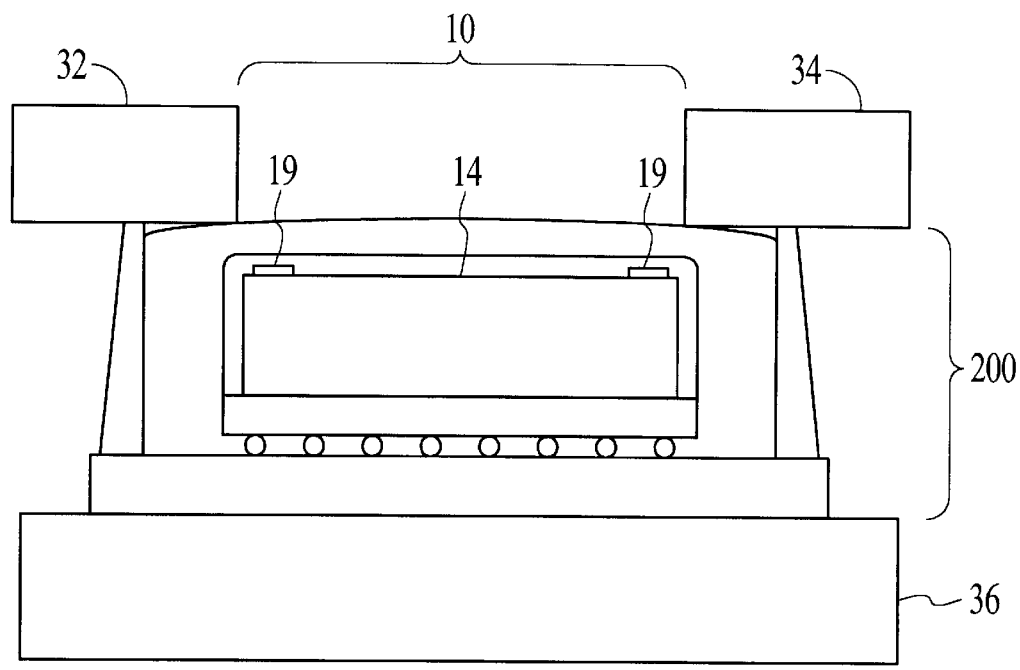
FIG. 7A is one embodiment the chip-scale package during decapsulating in accordance with the present invention.

FIG. 7A depicts the receptacle 200 being held in a conventional apparatus for decapsulating via clamps 32 and 34. The clamps 32 and 34 hold the receptacle 200 by the periphery 208 of the receptacle 200. Consequently, the chip-scale package 10, including the edges of the chip-scale package 10, can be exposed during decapsulation.

Figure 7B:
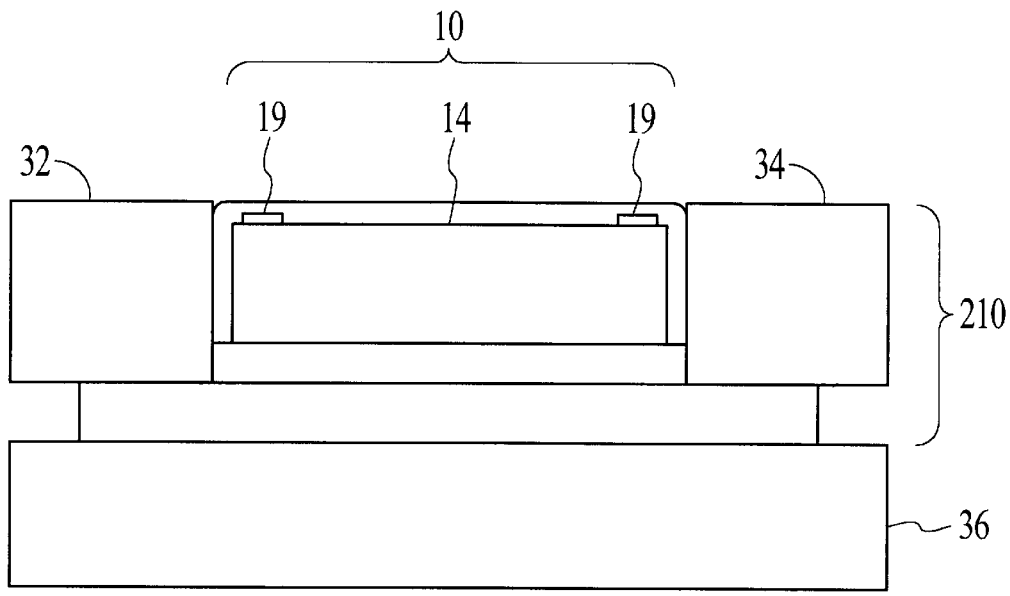
FIG. 7B is a second embodiment the chip-scale package during decapsulating in accordance with the present invention.

Similarly, FIG. 7B depicts the receptacle 210 being held in a conventional apparatus for decapsulation via clamps 32 and 34. The clamps 32 and 34 hold the receptacle 210 by the periphery 218 of the receptacle 210. Consequently, the chip-scale package 10, including the edges of the chip-scale package 10, can be exposed during decapsulation.

Because the chip-scale package 10 is held in the receptacle 200 or 210, the chip-scale package 10 can be exposed during decapsulation. For example, the bond pads 19 can be exposed and investigated during processing. In addition, electrical contact can be made through receptacles 200 and 210, respectively, to the semiconductor die 14 in the chip-scale package 10. This is facilitated by the fact that the substrate 16 can be protected by the receptacle 200 or 210, allowing connection to be made through the substrate 16. Consequently, the functionality of the semiconductor die 14 can also be checked during decapsulation.

A method and system has been disclosed for providing a receptacle for holding a chip-scale package in place during decapsulation. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for decapsulating a chip-scale package having a first width and a first surface, the method comprising the steps of:
   (a) coupling the chip-scale package to a substantially rigid receptacle, the receptacle having a second width and a periphery, the second width being larger than the first width, the chip-scale package not extending to the periphery;
   (b) holding the receptacle in proximity to the periphery such that all of the first surface of the chip-scale package is exposed for decapsulation; and
   (c) decapsulating the chip-scale package.

2. The method of claim 1 wherein the receptacle further includes a socket adapted to fit the chip-scale package, the coupling step further includes the step of:
   (a1) placing the chip-scale package in the socket.

3. The method of claim 1 wherein the chip-scale package further includes a substrate and wherein the coupling step (a) further includes the step of:
   (a1) coupling the chip-scale package to the substantially rigid receptacle such that the substrate is protected during the decapsulating step (c).

4. The method of claim 1 wherein the receptacle further includes a plurality of traces for making electrical contact with the semiconductor die.

5. The method of claim 4 wherein the chip-scale package includes a semiconductor die coupled to a substrate and a plurality of solder balls coupled to the substrate, the coupling step further includes the step of:
   (a1) heating the substrate; wherein a portion of the plurality of solder balls are attached to the receptacle.

6. The method of claim 1 wherein the coupling step further includes the step of:
   (a1) using a molding compound to couple the chip-scale package to the receptacle.

7. The method of claim 6 wherein the receptacle further has a cavity therein, at least a portion of the cavity being surrounded by a dam, and wherein the coupling step further includes the step of:
   (a2) placing the chip-scale package in the cavity;
   (a3) filling a remaining portion of the cavity with the molding compound; and
   (a4) curing the molding compound.

8. A system for facilitating decapsulating a chip-scale package having a first width and a first surface, the system comprising:
   a substantially rigid receptacle having a second width and a periphery, the second width being larger than the first width, the receptacle being configured to receive the chip-scale package such that the chip-scale package does not extend to the periphery;
   wherein the chip-scale package can be immobilized by holding the periphery of the receptacle such that all of the first surface of the chip-scale package is exposed for decapsulation.

9. The system of claim 8 wherein the receptacle further includes a socket adapted to fit the chip-scale package.

10. The system of claim 8 wherein the chip-scale package has a substrate and wherein the receptacle is configured to allow the substrate to be protected during decapsulation.

11. The system of claim 8 wherein the chip-scale package further includes a semiconductor die coupled to the substrate, and wherein the receptacle further includes:
   a plurality of conductive traces for making electrical contact to a portion of the semiconductor die.

12. The system of claim 11 wherein chip-scale package further includes a plurality of solder balls coupled to the substrate wherein the receptacle is configured to be attached to the chip-scale package by heating the plurality of solder balls.

13. The system of claim 8 wherein the receptacle is configured to receive the chip-scale package and hold the chip scale package using a molding compound.

14. The system of claim 13 wherein the receptacle further has a cavity therein, at least a portion of the cavity being surrounded by a dam, the cavity for receiving the chip-scale package and the molding compound therein, the dam for substantially retaining the molding compound in the cavity.

* * * * *